United States Patent
Cox et al.

(10) Patent No.: US 9,668,369 B2
(45) Date of Patent: May 30, 2017

(54) COLLAPSIBLE ENCLOSURE COVER FOR FACILITATING AIR FLOW FOR AN ENCLOSURE

(71) Applicant: International Business Machines Corporation, Armonk, NY (US)

(72) Inventors: Aaron R. Cox, Tucson, AZ (US); Camillo Sassano, Durham, NC (US); Joni E. Saylor, Austin, TX (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/974,284

(22) Filed: Dec. 18, 2015

(65) Prior Publication Data

US 2016/0095243 A1    Mar. 31, 2016

Related U.S. Application Data

(63) Continuation of application No. 14/277,900, filed on May 15, 2014.

(51) Int. Cl.
| | |
|---|---|
| *H05K 5/03* | (2006.01) |
| *H05K 7/20* | (2006.01) |
| *H05K 5/02* | (2006.01) |

(52) U.S. Cl.
CPC ............ *H05K 5/03* (2013.01); *H05K 5/0217* (2013.01); *H05K 7/20145* (2013.01); *H05K 7/20745* (2013.01)

(58) Field of Classification Search
CPC ........ E04H 15/48; H05K 5/03; H05K 5/0217; H05K 7/20745; H05K 7/20145

USPC .............. 135/147, 148, 152, 153; 52/63, 65; 361/690, 694, 695
See application file for complete search history.

(56) References Cited

U.S. PATENT DOCUMENTS

| | | | |
|---|---|---|---|
| 4,084,599 A * | 4/1978 | Matthews | ............... E04H 4/108 135/132 |
| 4,716,919 A | 1/1988 | Griffin | |
| 5,655,559 A | 8/1997 | Zembik et al. | |
| 5,918,615 A | 7/1999 | Stuck, Sr. | |
| 6,145,525 A * | 11/2000 | Mooney | .................... E04H 5/02 135/119 |

(Continued)

FOREIGN PATENT DOCUMENTS

WO    2008122977 A2    10/2008

OTHER PUBLICATIONS

ALHOF, "19" Data Racks", AlHof.com, Product Catalog, © 2007 AlHof S.p.A. http://www.alhof.com/cataloghi/cat_p021_f17.pdf.

(Continued)

*Primary Examiner* — Noah Chandler Hawk
(74) *Attorney, Agent, or Firm* — Nolan M. Lawrence

(57) ABSTRACT

A collapsible enclosure cover for facilitating air flow for an enclosure having a collapsible frame with a first guide rail having a mounting bracket and an elongated member. The collapsible frame also has a second guide rail having a mounting bracket and an elongated member. The collapsible frame also has a plurality of poles extending from the first guide rail to the second guide rail that swivel around the elongated members. The collapsible enclosure cover also has a fabric portion connected to and disposed over the plurality of poles.

1 Claim, 6 Drawing Sheets

(56) References Cited

U.S. PATENT DOCUMENTS

| | | |
|---|---|---|
| 6,222,730 B1 | 4/2001 | Korvenheimo et al. |
| 6,349,732 B1 | 2/2002 | Cooper |
| 7,258,153 B2 | 8/2007 | Chen |
| 7,534,167 B2 | 5/2009 | Day |
| 8,154,870 B1 | 4/2012 | Czamara et al. |
| 8,371,322 B1 * | 2/2013 | Wilson-Campbell ............. E04H 15/003 135/117 |
| 8,490,799 B2 | 7/2013 | Knight et al. |
| 8,498,114 B2 | 7/2013 | Martini |
| 8,640,395 B2 | 2/2014 | DiSabantonio, III |
| 8,941,993 B2 | 1/2015 | Eckberg et al. |
| 9,072,200 B2 | 6/2015 | Dersch et al. |
| 2006/0260338 A1 | 11/2006 | VanGuilder et al. |
| 2012/0129441 A1 | 5/2012 | Peng et al. |
| 2012/0285096 A1 | 11/2012 | Green |
| 2013/0029584 A1 | 1/2013 | Chan et al. |
| 2015/0145391 A1 | 5/2015 | Broome et al. |
| 2015/0305202 A1 | 10/2015 | Veino et al. |

OTHER PUBLICATIONS

COMPAQ, "Compaq Rack 9000 Series", pp. 1-5. ftp://ftp.compaq.com/pub/products/storageworks/options/Rack9000dt.pdf.

Niemann, "Hot Aisle vs. Cold Aisle Containment", White Paper #135, APC, pp. 1-13, © 2008 American Power Conversion. http://www.apcdistributors.com/white-papers/Cooling/WP-135%20Hot%20Aisle%20vs.%20Cold%20Aisle%20Containment.pdf.

Panduit, "Net-Access™ Server Cabinets—32" x 40"", Panduit® Specification Sheet, Aug. 2011, © 2011 Panduit Corp. http://www.panduit.com/heiler/SpecificationSheets/WW-RKSP63%20Net-Access%20Server%20Cabinet%20WEB%208-8-11.pdf.

Cox et al., "Collapsible Enclosure Cover for Facilitating Air Flow for an Enclosure", U.S. Appl. No. 14/277,900, filed May 15, 2014.

IBM, List of IBM Patents or Patent Applications Treated as Related, Nov. 29, 2016, 2 pages.

* cited by examiner

COLLAPSIBLE ENCLOSURE COVER FOR FACILITATING AIR FLOW FOR AN ENCLOSURE

BACKGROUND

The present disclosure relates to cooling data center equipment, and more specifically to a collapsible cover configured to attach to an electronic module enclosure to facilitate the directing of warm air flow from an electronic module to a cooling system and cool air flow from the cooling system to the electronic module. Cooling needs for enterprise data center equipment are increasing as equipment performance increases. Cooling efficiency in data centers translates into electricity cost savings, while reducing the environmental footprint of a data center. There is increased industry attention to data center infrastructure technologies that minimize electricity consumption.

SUMMARY

According to embodiments of the present disclosure, a collapsible enclosure cover for facilitating air flow for an enclosure having at least one module storage location and at least one cooling system storage location. In various embodiments, the cover can include a collapsible frame including a first guide rail. The first guide rail can include a first mounting bracket having a first end designed to attach to a top of an opening of the enclosure and having a second end with a first hole, and a first elongated member having a first end through the first hole. The collapsible frame can also include a second guide rail opposite the first guide rail. The second guide rail can include a second mounting bracket having a first end designed to attach to a bottom of the opening of the enclosure and having a second end with a second hole, and a second elongated member having a first end through the second hole and extending toward the first guide rail and having a same axis as the first elongated member. The collapsible frame can further include a plurality of poles extending from the first guide rail to the second guide rail, having first ends attached to the first elongated member and designed to swivel around the first elongated member and having second ends attached to the second elongated member and designed to swivel around the second elongated member. Furthermore, the cover can include a fabric portion connected to and disposed over the plurality of poles and, when in the installed position, designed to guide air to move between the at least one module storage location and the at least one cooling system storage location.

According to embodiments of the present disclosure, a system for facilitating air flow. In various embodiments, the system can include an enclosure including at least one module storage location, and at least one cooling system storage location. The system can also include a collapsible frame including a first guide rail. The first guide rail can include a first mounting bracket having a first end designed to attach to a top of an opening of the enclosure and having a second end with a first hole, and a first elongated member having a first end through the first hole. The collapsible frame can also include a second guide rail opposite the first guide rail. The second guide rail can include a second mounting bracket having a first end designed to attach to a bottom of the opening of the enclosure and having a second end with a second hole, and a second elongated member having a first end through the second hole and extending toward the first guide rail and having a same axis as the first elongated member. The collapsible frame can further include a plurality of poles extending from the first guide rail to the second guide rail, having first ends attached to the first elongated member and designed to swivel around the first elongated member and having second ends attached to the second elongated member and designed to swivel around the second elongated member. Furthermore, the system can include a fabric portion connected to and disposed over the plurality of poles and, when in the installed position, designed to guide air to move between the at least one module storage location and the at least one cooling system storage location.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
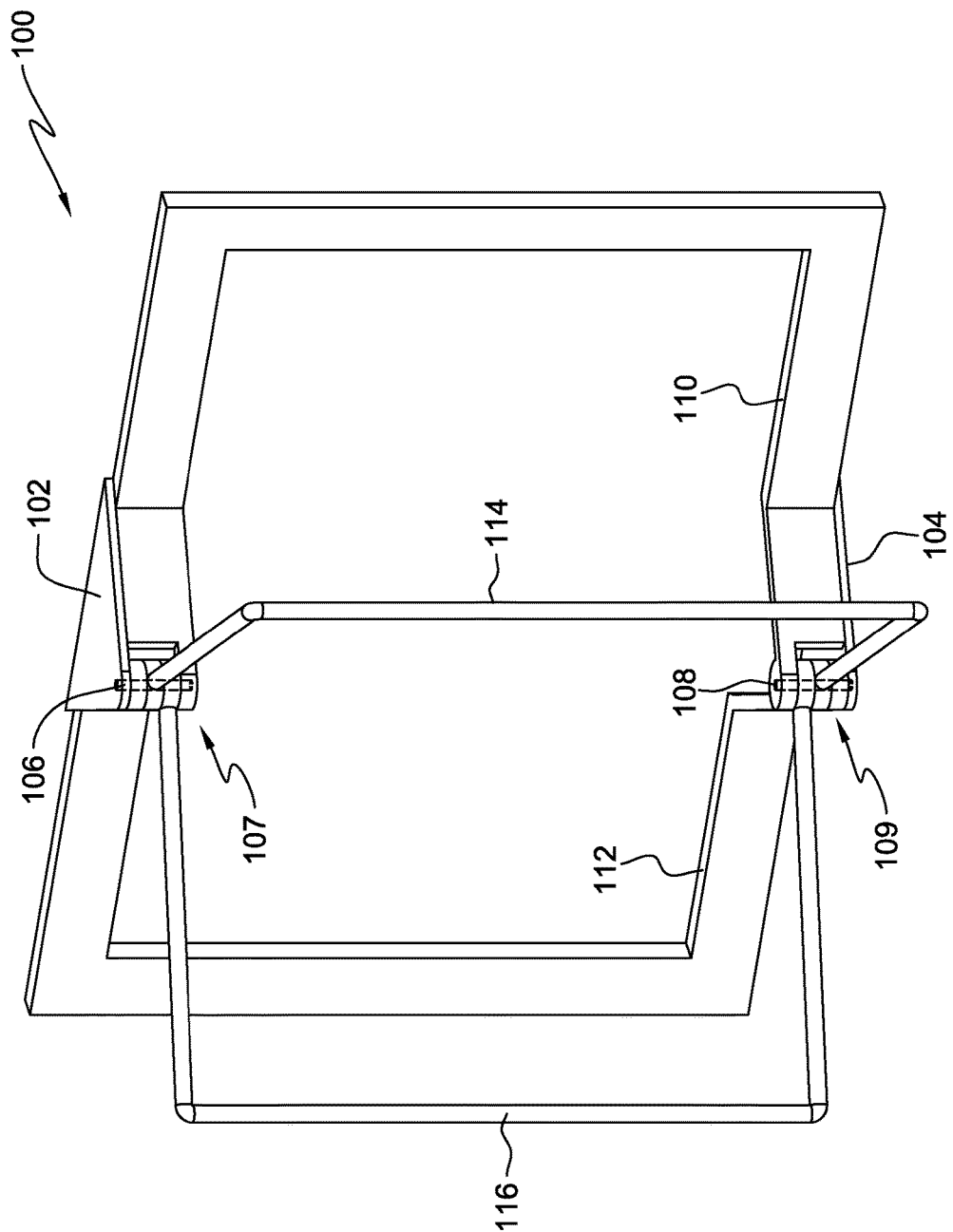
FIG. 1 depicts an unattached collapsible frame, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to cooling data center equipment, more particular aspects relate to a collapsible cover configured to attach to an electronic module enclosure to facilitate the directing of warm air from an electronic module to a cooling system and cool air from the cooling system to the electronic module. While the present disclosure is not necessarily limited to such applications, various aspects of the disclosure may be appreciated through a discussion of various examples using this context.

Various embodiments of the present disclosure are directed toward a collapsible cover that is designed for use with an electronic module enclosure. The cover can be designed with a collapsible frame and a flexible, air tight, fabric connected and disposed over the collapsible frame. In addition, the cover can be designed to attach to the electronic module enclosure and open, exposing only an electronic module compartment, or exposing only a cooling system compartment, or both. This can allow for access to the electronic module and the cooling system so they can be serviced, adjusted, replaced, etc. Furthermore, the cover can be designed to hinge 180 degrees and avoid creating an obstacle, especially when the electronic module enclosure is located in small or tight areas where space is scarce.

Certain embodiments are also directed toward a collapsible cover that is designed to collapse when not in use. This can be useful for ease of storage and transport. For instance, if servers are being stored in a data center and a new server has been placed in the data center, multiple covers can also be stored in the data center and are readily available whenever needed. Furthermore, the cover can be designed to be lighter than regular electronic module enclosure doors, therefore, decreasing the total weight of the electronic module enclosure.

Turning now to the figures, FIG. 1 depicts an unattached collapsible frame 100, consistent with embodiments of the present disclosure. The collapsible frame can include poles 110, 112, 114, and 116. Poles 110 and 112 can be designed to fit snugly and adjacently to a perimeter of the opening of the electronic module enclosure so that air flowing out of the electronic module enclosure can not escape through cracks between the poles 110, 112 and the electronic module enclosure. Furthermore, poles 110, 112 can be sturdy enough to support the weight of the collapsible cover so that the collapsible cover can not pull away from the electronic module enclosure and allow air to escape. Poles 114 and 116 can be designed to prevent a flexible fabric that is connected to and disposed over poles 110, 112, 114, and 116 from collapsing inward or bulging outward excessively.

Collapsible frame 100 can also include mounting brackets 102 and 104. Mounting brackets 102, 104 can be designed to further attach the collapsible frame to the electronic module enclosure. This can increase the stability between the collapsible frame and the electronic module enclosure so that air flowing out of the electronic module enclosure can not escape through cracks between the poles 110, 112 and the electronic module enclosure. As shown, mounting brackets 102, 104 can be fitted with elongated members 106 and 108 and the ends of poles 110, 112, 114, and 116 can be attached to elongated members 106 and 108. The combination of the mounting brackets and elongated members can create guide rails 107 and 109 that allow the poles to swivel around the elongated members and allow the poles to unfold and cover a module storage location and a cooling system storage location of the electronic module enclosure. By swiveling around the elongated members, the poles can fold and unfold, thus creating the collapsibility of the collapsible frame 100. Furthermore, with this collapsibility capability, the poles can extend to cover an opening of an electronic module storage location and an opening of a cooling system storage location of the electronic module enclosure.

Figure 2:
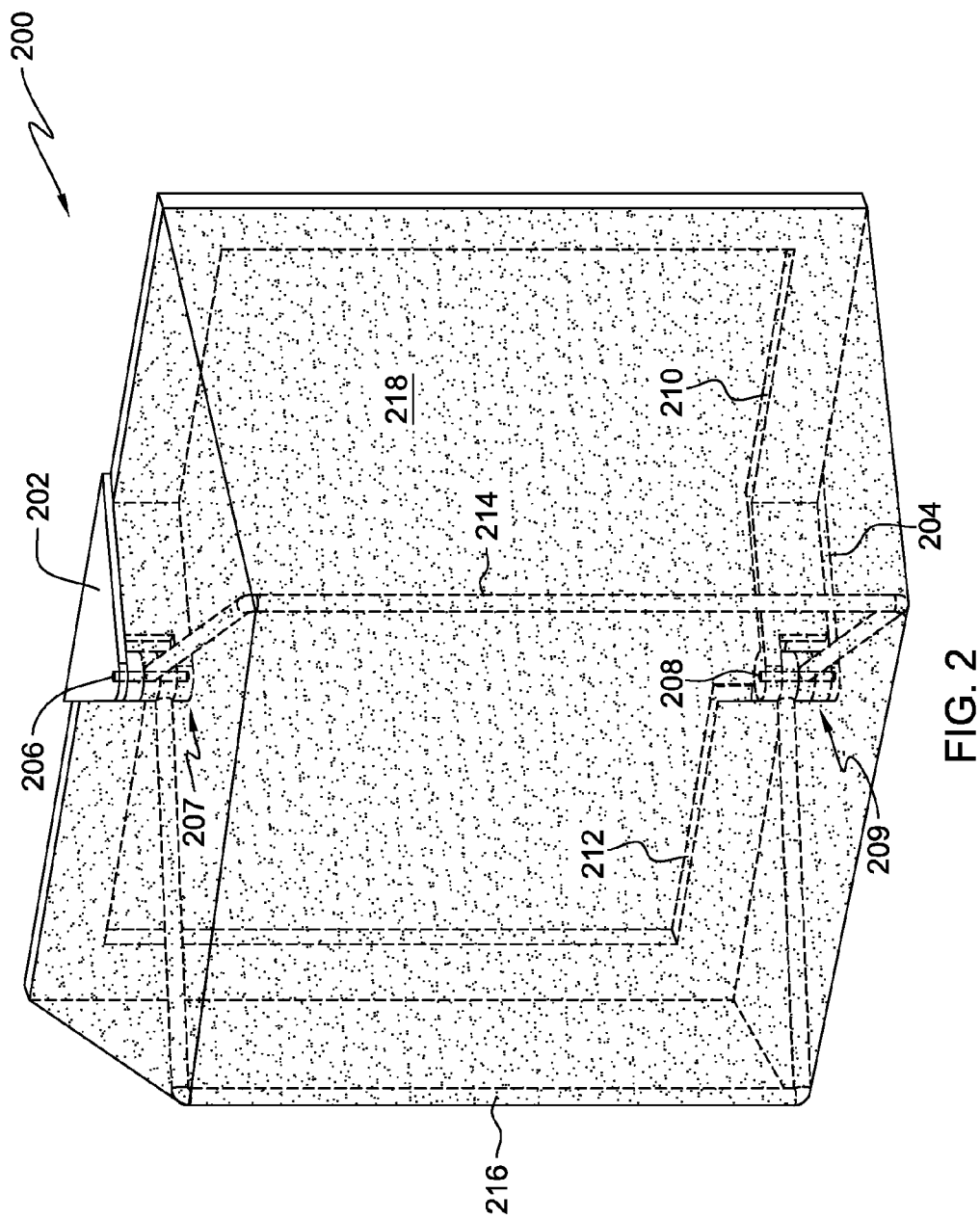
FIG. 2 depicts an unattached collapsible cover, consistent with embodiments of the present disclosure.

FIG. 2 depicts an unattached collapsible cover 200, consistent with embodiments of the present disclosure. The collapsible cover 200 can include poles 210, 212, 214, and 216, mounting brackets 202 and 204 and elongated members 206 and 208. The mounting brackets 202 and elongated member 206 make up guide rail 207 and mounting bracket 204 and elongated member 208 make up guide rail 209. The parts can be assembled and configured into a collapsible frame that operates in relatively the same manner as discussed above for the collapsible frame 100, from FIG. 1. As shown, the collapsible cover 200 can also include a flexible fabric 218 connected to and disposed over the collapsible frame. The flexible fabric 218 can be designed so that air can not substantially penetrate through the flexible fabric and can be composed of many materials, such as nylon, vinyl, and canvas. The flexible fabric can also be cut in a shape and size that closely conforms to one or more surfaces defined by the collapsible frame. Also, the flexible fabric can be cut so that the top and bottom horizontal portions of the collapsible frame are covered by the flexible fabric. Furthermore, if necessary, the collapsible cover 200 can be coated with a metallic material, such as aluminum, copper, or tin to fulfill electromagnetic control (EMC) or electrostatic discharge (ESD) requirements.

Figure 3:
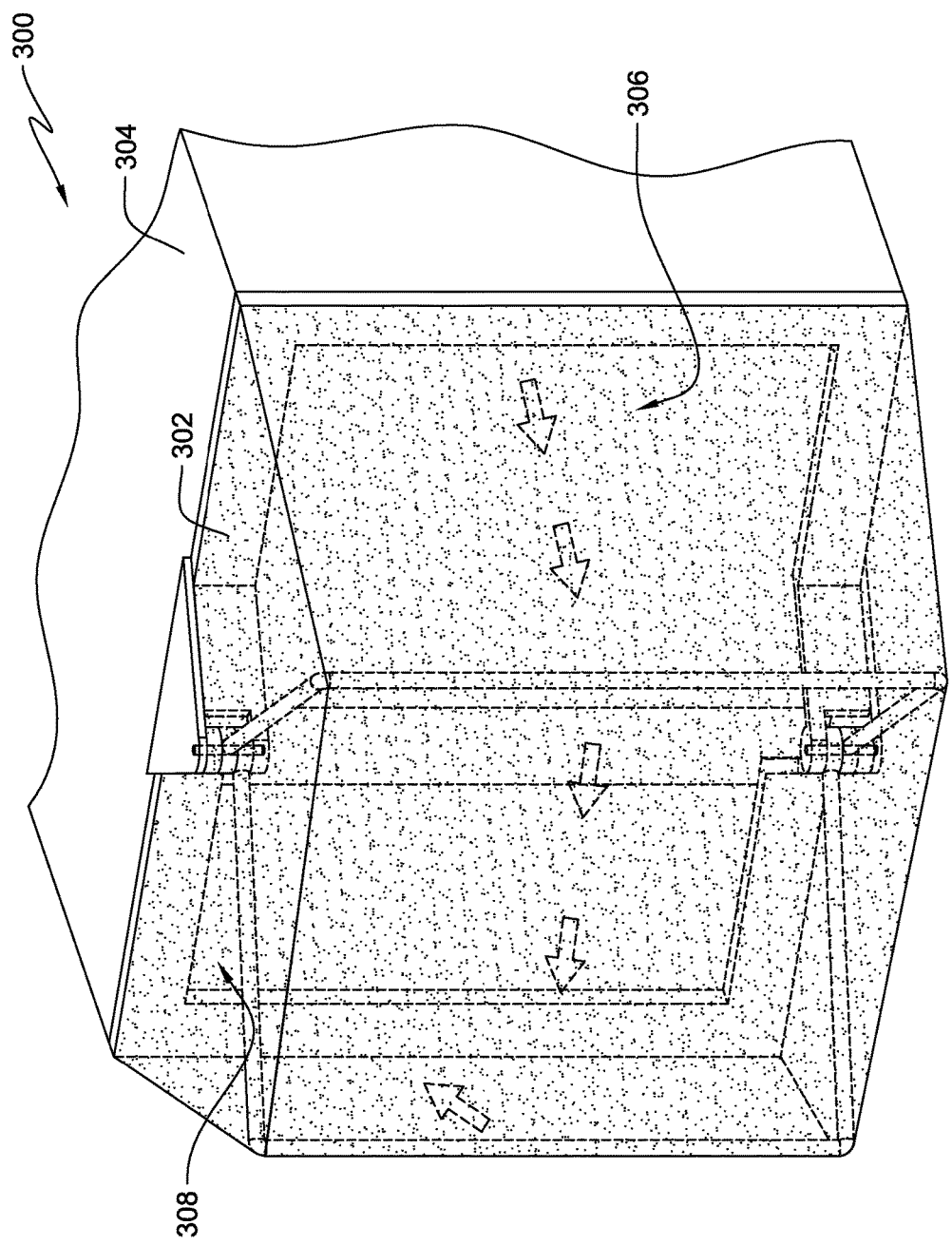
FIG. 3 depicts an example of a collapsible cover attached to an electronic module enclosure, consistent with embodiments of the present disclosure.

FIG. 3 depicts an example 300 of a collapsible cover attached to an electronic module enclosure, consistent with embodiments of the present disclosure. The collapsible cover 302 can be configured in relatively the same manner as discussed above for the collapsible cover 200, from FIG. 2. As shown, the electronic module enclosure 304 can include a module storage location 306 and a cooling system storage location 308.

The collapsible cover 302 can be designed to fit snugly on the front or back of the electronic module enclosure 304 (not shown fitted on the back in FIG. 3). For example, the collapsible cover can be attached to the electronic module enclosure by snaps, clips, clamps, hooks, clasps, flanges, magnets, pins, fasteners, straps, ties, etc. Also, the collapsible cover can be installed on the electronic module enclosure such that the collapsible cover remains in a substantially static position relative to at least a portion of the electronic module enclosure. For example, the collapsible cover can be secured to the electronic module enclosure by attaching poles, e.g. poles 210 and 212 from FIG. 2, around a perimeter of the electronic module enclosure. In addition, poles, e.g. poles 210, 212, 214, and 216 from FIG. 2, can be bent to create a pathway between the electronic module enclosure opening and the flexible fabric, e.g. flexible fabric 218 from FIG. 2, so air can move along the pathway between the module storage location 306 and the cooling system storage location 308. Furthermore, the collapsible cover can have guiding rails, e.g. guiding rails 207 and 209, that are attached to the top and bottom of the opening of the electronic module enclosure.

In such a configuration, the collapsible cover 302 can guide the air that propagates from an electronic module (not shown) located in the module storage location 306 to a cooling system (not shown) located in the cooling system storage location 308 or vice versa. For example, the arrows in FIG. 3 are shown to represent the path of warm air coming out of the module storage location 306. As illustrated, the warm air moves out of the front of the module storage location and is guided by the collapsible cover around a boundary between the module storage location and the cooling system storage location. The warm air is then further guided by the collapsible cover into the front of the cooling system storage location 308 where a cooling system can cool the warm air.

The cooled air can then travel out the back of the cooling system storage location 308 where another collapsible cover (not shown) can be located to guide the cool air into the back of the module storage location 306, where the cycle can be repeated. However, this is only an example and the cooled air can reenter the module storage location 306 by other means. For instance, there can be a gap in the boundary between the module storage location 306 and the cooling system storage location 308 and the cooled air can travel through the gap into the module storage location 306. In addition, the collapsible cover 302 can be used exclusively to guide cooled air from the cooling system storage location 308 to the module storage location 306 and the warm air can reenter the cooling system storage location through a gap in the boundary between the module storage location and the cooling system storage location. Furthermore, the collapsible cover can be used exclusively to redirect cool air and warm air can be released out the front or back of the electronic module enclosure 304 and not be recycled through the cooling system.

Figure 4B:
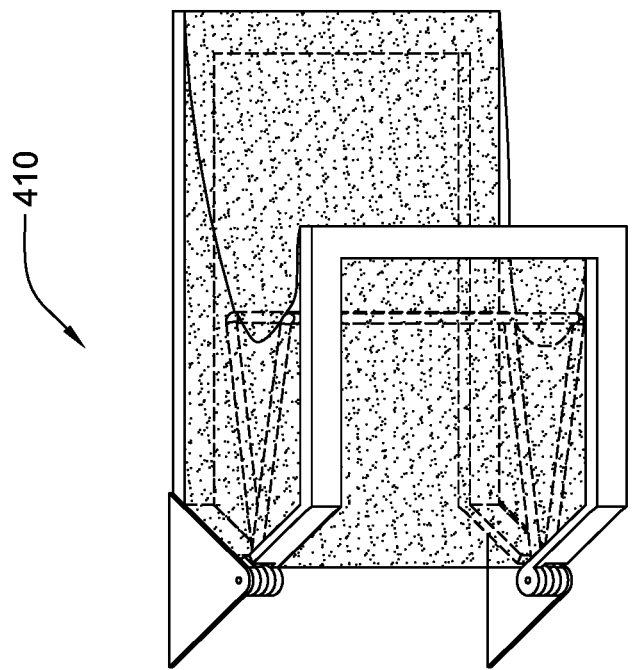
FIG. 4B depicts a second example of an unattached, partially collapsed, cover, consistent with embodiments of the present disclosure.
Figure 4A:
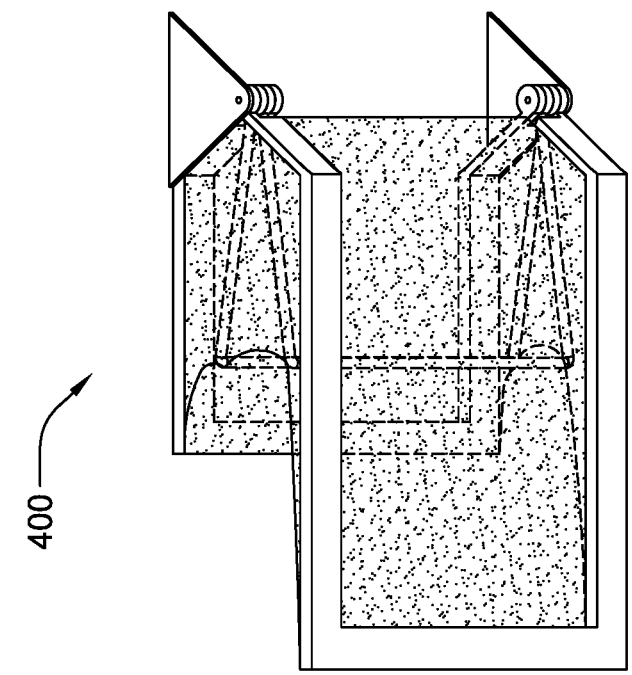
FIG. 4A depicts a first example of an unattached, partially collapsed, cover, consistent with embodiments of the present disclosure.

FIG. 4A depicts a first example of an unattached, partially collapsed, cover 400, consistent with embodiments of the present disclosure. The collapsible cover 400 can be configured in relatively the same manner as discussed above for the collapsible cover 200, from FIG. 2. As shown, the collapsible cover 400 can hinge at elongated members where the ends of the poles, e.g. poles 110 and 112 from FIG. 1, are attached. This can enable the poles of collapsible cover 400 to fold, opening the collapsible cover, and allowing access to strictly an electronic module located in a module storage location, e.g. module storage location 306 from FIG. 3, while a cooling system storage location, e.g. cooling system storage location 308 from FIG. 3, remains covered by a portion of the collapsible cover. Furthermore, when unattached, FIG. 4A depicts the poles folded up, allowing the collapsibility of the cover 400 and creating ease of storage and transport.

FIG. 4B depicts a second example of an unattached, partially collapsed, cover 410, consistent with embodiments of the present disclosure. The collapsible cover 410 can be configured in relatively the same manner as discussed above for the collapsible cover 200, from FIG. 2. As shown, the collapsible cover 410 can hinge at elongated members where the ends of the poles, e.g. poles 110 and 112 from FIG. 1, are attached. This can enable the poles of collapsible cover 410 to fold, opening the collapsible cover 410, and allowing access to strictly a cooling system located in a cooling system storage location, e.g. cooling system storage location 308 from FIG. 3, while a module storage location, e.g. module storage location 306 from FIG. 3, remains covered by a portion of the collapsible cover. Furthermore, when unattached, FIG. 4B depicts the poles folded up, allowing the collapsibility of the cover 410 and creating ease of storage and transport.

Figure 5A:
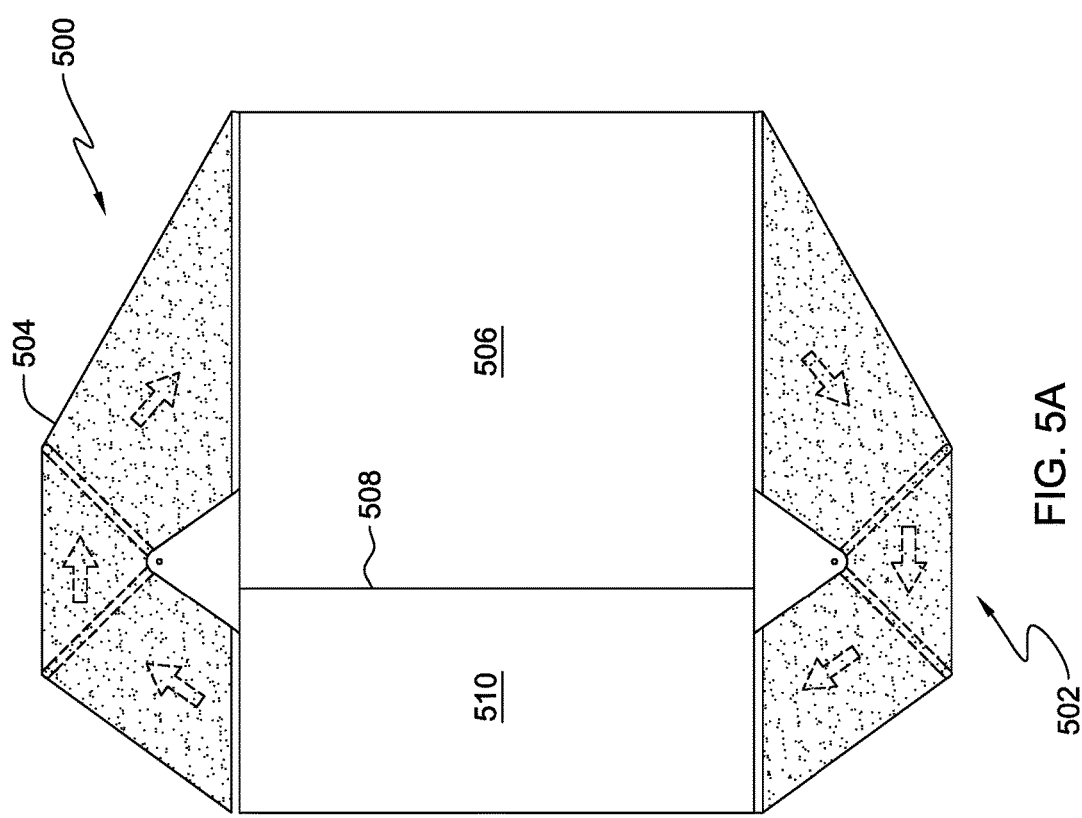
FIG. 5A depicts a top view example of two collapsible covers attached to the front and back of an electronic module enclosure, consistent with embodiments of the present disclosure.

FIG. 5A depicts a top view example 500 of two collapsible covers attached to the front and back of an electronic module enclosure, consistent with embodiments of the present disclosure. The collapsible covers 502 and 504 can be configured in relatively the same manner as discussed above for the collapsible cover 200, from FIG. 2. As shown, the arrows represent the path of warm air coming out of a module storage location 506. The warm air moves out of module storage location and is guided by the collapsible cover 502 around a boundary 508 between the module storage location 506 and a cooling system storage location 510. The warm air is then further guided by the collapsible cover 502 into the cooling system storage location 510 where a cooling system (not shown) can cool the warm air. The cooled air can then travel out the back of the cooling system storage location where the collapsible cover 504 is located to guide the cool air back into the module storage location 506 and the cycle is repeated.

Figure 5B:
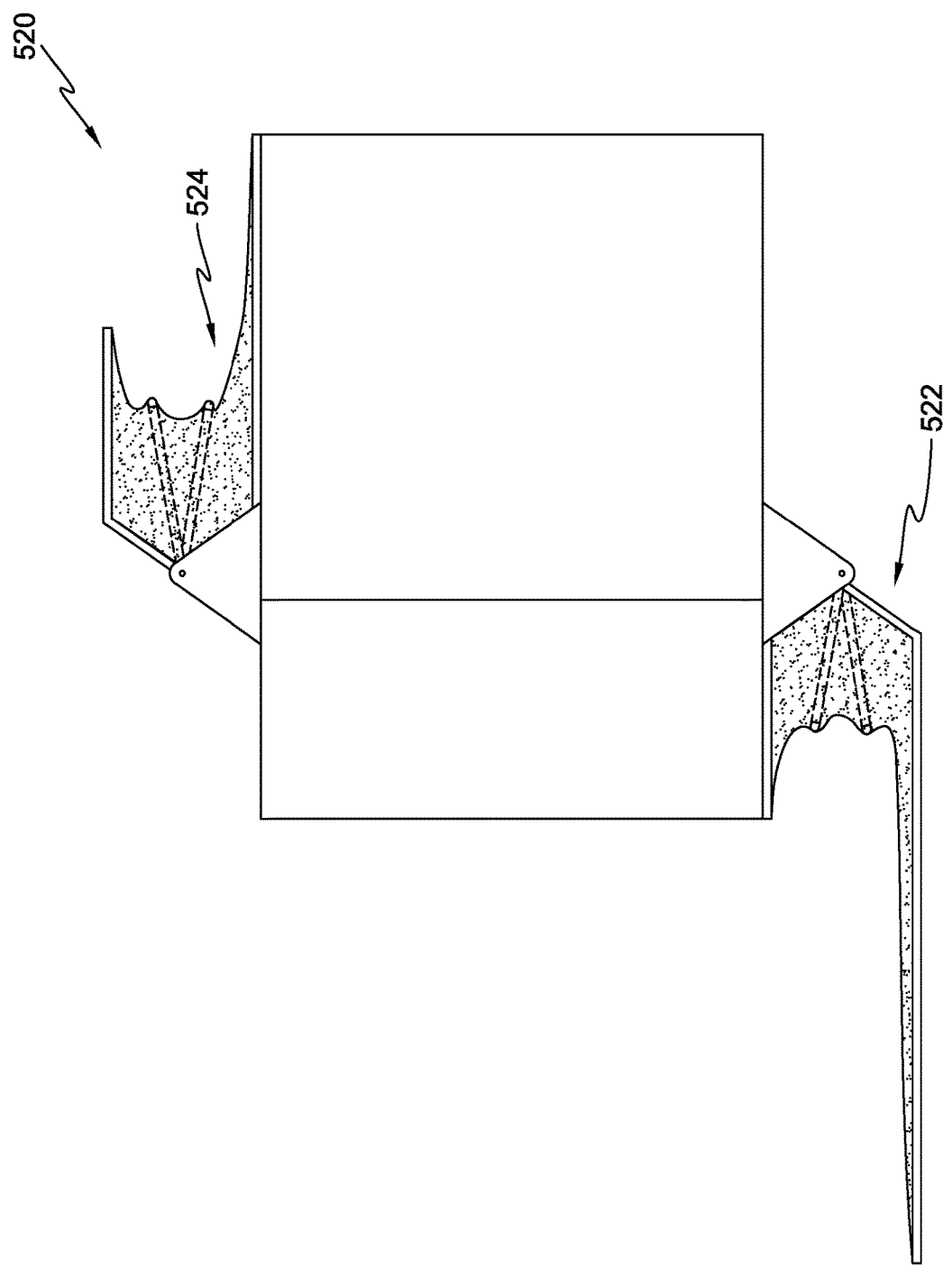
FIG. 5B depicts a top view example of two, partially collapsed, covers attached to the front and back of an electronic module enclosure, consistent with embodiments of the present disclosure.

FIG. 5B depicts a top view example 520 of two, partially collapsed, covers attached to the front and back of an electronic module enclosure, consistent with embodiments of the present disclosure. The collapsible covers 522 and 524 can be configured in relatively the same manner as discussed above for the collapsible cover 200, from FIG. 2. As shown, the collapsible enclosure cover 524 can open, exposing a cooling system storage location with a pole still attached to a part of the perimeter of the opening of the enclosure and still covering a module storage location. Furthermore, the collapsible cover 522 can open, exposing the module storage location with a pole still attached to a part of the perimeter of the opening of the enclosure and still covering the cooling system storage location.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A collapsible enclosure cover comprising:
a top guide rail of a collapsible frame, the top guide rail including a top mounting bracket and a top elongated member, the top mounting bracket designed to attach to a top of an opening of an enclosure, the enclosure having an electronic module storage location and a cooling system storage location, the top mounting bracket further designed to attach to the top of the opening of the enclosure between the electronic module storage location and the cooling system storage location, the top elongated member extending along an axis through a hole in the top mounting bracket;
a bottom guide rail of the collapsible frame, the bottom guide rail opposite the top guide rail, the bottom guide rail including a bottom mounting bracket substantially similar to the top mounting bracket and a bottom elongated member substantially similar to the top elongated member, the bottom mounting bracket designed to attach to a bottom of the opening of the enclosure, the bottom mounting bracket further designed to attach to the bottom of the opening of the enclosure between the electronic module storage location and the cooling system storage location, the bottom elongated member extending along the axis through a hole in the bottom mounting bracket;
a first pole of the collapsible frame, the first pole extending from the top guide rail to the bottom guide rail, the first pole having a first shape including a top portion, a middle portion, and a bottom portion, the top portion and the bottom portion substantially orthogonal to the axis, the middle portion substantially parallel to the axis, a top end of the first pole attached to the top guide rail by the top elongated member, a bottom end of the first pole attached to the bottom guide rail by the bottom elongated member, the first pole designed to swivel about the axis, the first shape of the first pole substantially similar to a perimeter of the electronic module storage location in the enclosure;
a second pole of the collapsible frame, the second pole extending from the top guide rail to the bottom guide rail, the second pole having a second shape including a top portion, a middle portion, and a bottom portion, the top portion and the bottom portion substantially orthogonal to the axis, the middle portion substantially parallel to the axis, a top end of the second pole attached to the top guide rail by the top elongated member, a bottom end of the second pole attached to the bottom guide rail by the bottom elongated member, the second pole designed to swivel about the axis, the second shape of the second pole substantially similar to a perimeter of the cooling system storage location in the enclosure, wherein the first shape is different from the second shape;

at least two intermediate poles of the collapsible frame between the first pole and the second pole, the at least two intermediate poles extending from the top guide rail to the bottom guide rail, the at least two intermediate poles each including a top portion, a middle portion, and a bottom portion, the top portion and the bottom portion substantially orthogonal to the axis, the middle portion substantially parallel to the axis, a top end of each of the at least two intermediate poles attached to the top guide rail by the top elongated member, a bottom end of each of the at least two intermediate poles attached to the bottom guide rail by the bottom elongated member, the at least two intermediate poles designed to swivel about the axis;

a flexible air tight fabric fastened to the first pole and the second pole and disposed over the at least two intermediate poles, the flexible air tight fabric providing an air flow channel between the electronic module storage location and the cooling system storage location when the collapsible enclosure cover is installed over the enclosure, the first pole of the installed collapsible enclosure cover snugly adjacent to the perimeter of the electronic module storage location, the second pole of the installed collapsible enclosure cover snugly adjacent to the perimeter of the cooling system storage location; and a metallic material coating the flexible air tight fabric.

* * * * *